United States Patent
Sawada et al.

(10) Patent No.: US 12,369,245 B2
(45) Date of Patent: Jul. 22, 2025

(54) PRINTED CIRCUIT BOARD FOR DEGRADATION DETECTION

(71) Applicant: FANUC CORPORATION, Yamanashi (JP)

(72) Inventors: Takeshi Sawada, Yamanashi-ken (JP); Fuyuki Ueno, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 279 days.

(21) Appl. No.: 18/040,352

(22) PCT Filed: Jul. 28, 2021

(86) PCT No.: PCT/JP2021/027827
§ 371 (c)(1),
(2) Date: Feb. 2, 2023

(87) PCT Pub. No.: WO2022/030320
PCT Pub. Date: Feb. 10, 2022

(65) Prior Publication Data
US 2023/0276569 A1 Aug. 31, 2023

(30) Foreign Application Priority Data
Aug. 3, 2020 (JP) ................. 2020-131322

(51) Int. Cl.
H05K 1/02 (2006.01)
(52) U.S. Cl.
CPC ......... H05K 1/0268 (2013.01); H05K 1/0296 (2013.01)
(58) Field of Classification Search
CPC ............................ H01K 1/0296; H01K 1/0298

USPC ........................................................ 324/763.01
See application file for complete search history.

(56) References Cited

U.S. PATENT DOCUMENTS

| 6,297,458 B1* | 10/2001 | McMillan | H05K 1/0268 |
| | | | 174/250 |
| 2018/0070442 A1* | 3/2018 | Sawada | H05K 1/0268 |

FOREIGN PATENT DOCUMENTS

| JP | H5-119007 A | 5/1993 |
| JP | H8-220158 A | 8/1996 |
| JP | H9-046010 A | 2/1997 |
| JP | 2000-315446 A | 11/2000 |

(Continued)

OTHER PUBLICATIONS

Translation of PCT/JP2021/027827 (Year: 2021).*
International Search Report for PCT/JP2021/027827, dated Sep. 28, 2021.

*Primary Examiner* — Paresh Patel
(74) *Attorney, Agent, or Firm* — Sughrue Mion, PLLC

(57) ABSTRACT

Provided is a printed circuit board for degradation detection, the printed circuit board having an insulator substrate and a wiring pattern for degradation detection, the wiring pattern being formed on an outer surface of the insulator substrate, and the printed circuit board for degradation detection being attached to a main printed circuit board for which degradation is to be detected. The wiring pattern is formed on, of the outer surfaces of the insulator substrate, a back surface positioned on the main printed circuit board side. The insulator substrate has a penetrating part (through hole, notch part) penetrating from the back surface to a front surface positioned on the side opposite from the back surface.

4 Claims, 5 Drawing Sheets

(56) References Cited

FOREIGN PATENT DOCUMENTS

| | | | |
|---|---|---|---|
| JP | 2002-340962 | A | 11/2002 |
| JP | 2011-253849 | A | 12/2011 |
| JP | 2015-068652 | A | 4/2015 |
| JP | 2017-020845 | A | 1/2017 |
| JP | 2018-041837 | A | 3/2018 |
| JP | 2018-155558 | A | 10/2018 |
| JP | 2019-128194 | A | 8/2019 |
| JP | 2019-153696 | A | 9/2019 |

\* cited by examiner

PRINTED CIRCUIT BOARD FOR DEGRADATION DETECTION

CROSS REFERENCE TO RELATED APPLICATIONS

This application is a National Stage of International Application No. PCT/JP2021/027827 filed Jul. 28, 2021, claiming priority based on Japanese Patent Application No. 2020-131322 filed Aug. 3, 2020, the disclosures of which are incorporated by reference.

TECHNICAL FIELD

The present invention relates to a printed circuit board for degradation detection, which is attached to a main printed circuit board to be subjected to degradation detection.

BACKGROUND ART

A machine tool is used in an environment where a cutting fluid containing foreign material such as chlorides and sulfides is scattered. When the cutting fluid adheres to a main printed circuit board of the machine tool, the copper foil portion of a wiring pattern is corroded and the wiring pattern is disconnected. In order to predict disconnection of the wiring pattern, a printed circuit board for degradation detection is attached to the main printed circuit board. The printed circuit board for degradation detection has a wiring pattern for degradation detection which is more likely to be disconnected than the wiring pattern of the main printed circuit board.

For example, the printed circuit board for degradation detection includes an insulating substrate and wiring patterns formed on both surfaces of the insulating substrate. The wiring pattern is degraded by adhesion of the cutting fluid in the form of mist scattered in the space. On the other hand, the wiring pattern is degraded by adhesion of the cutting fluid flowing on the surface of the main printed circuit board or the cutting fluid flowing on the surface of the insulating substrate. However, when the wiring patterns are formed on both surfaces of the insulating substrate, the manufacturing cost of the printed circuit board for degradation detection increases.

JP 2018-041837 A discloses a printed circuit board for degradation detection having a wiring pattern on the back surface of an insulating substrate. No wiring pattern is formed on the front surface of the insulating substrate. Therefore, according to JP 2018-041837 A, the manufacturing cost of the printed circuit board for degradation detection can be suppressed.

SUMMARY OF THE INVENTION

A plurality of electrode pads connected to the wiring pattern of the main printed circuit board are provided on the back surface of the insulating substrate. The plurality of electrode pads are provided at an edge portion of the back surface in order to ensure the bonding strength of the printed circuit board for degradation detection to the main printed circuit board. Further, a flux scattered at the time of soldering adheres to the periphery of each electrode pad.

Recently, it has been found that the flux adhering to the plurality of electrode pads and the periphery thereof prevents the cutting fluid from entering the gap between the main printed circuit board and the printed circuit board for detection. In this case, the cutting fluid is less likely to adhere to the wiring pattern formed on the back surface of the insulating substrate, and disconnection is less likely to occur.

Therefore, it is an object of the present invention to provide a printed circuit board for degradation detection that can promote disconnection of a wiring pattern without increasing the manufacturing cost.

According to an aspect of the present invention, there is provided a printed circuit board for degradation detection comprising an insulating substrate and a wiring pattern for degradation detection formed on an outer surface of the insulating substrate, the printed circuit board for degradation detection being attached to a main printed circuit board to be subjected to degradation detection, wherein the wiring pattern is formed on a back surface that is the outer surface of the insulating substrate and that is located on a side of the main printed circuit board, and the insulating substrate includes a penetrating portion penetrating from the back surface to a front surface that is located on an opposite side to the back surface.

According to the present invention, disconnection of the wiring pattern can be promoted without increasing the manufacturing cost.

DETAILED DESCRIPTION OF THE INVENTION

A preferred embodiment of a printed circuit board for degradation detection according to the present invention will be presented and described in detail below with reference to the accompanying drawings.

1. Main Printed Circuit Board 10

Figure 1:
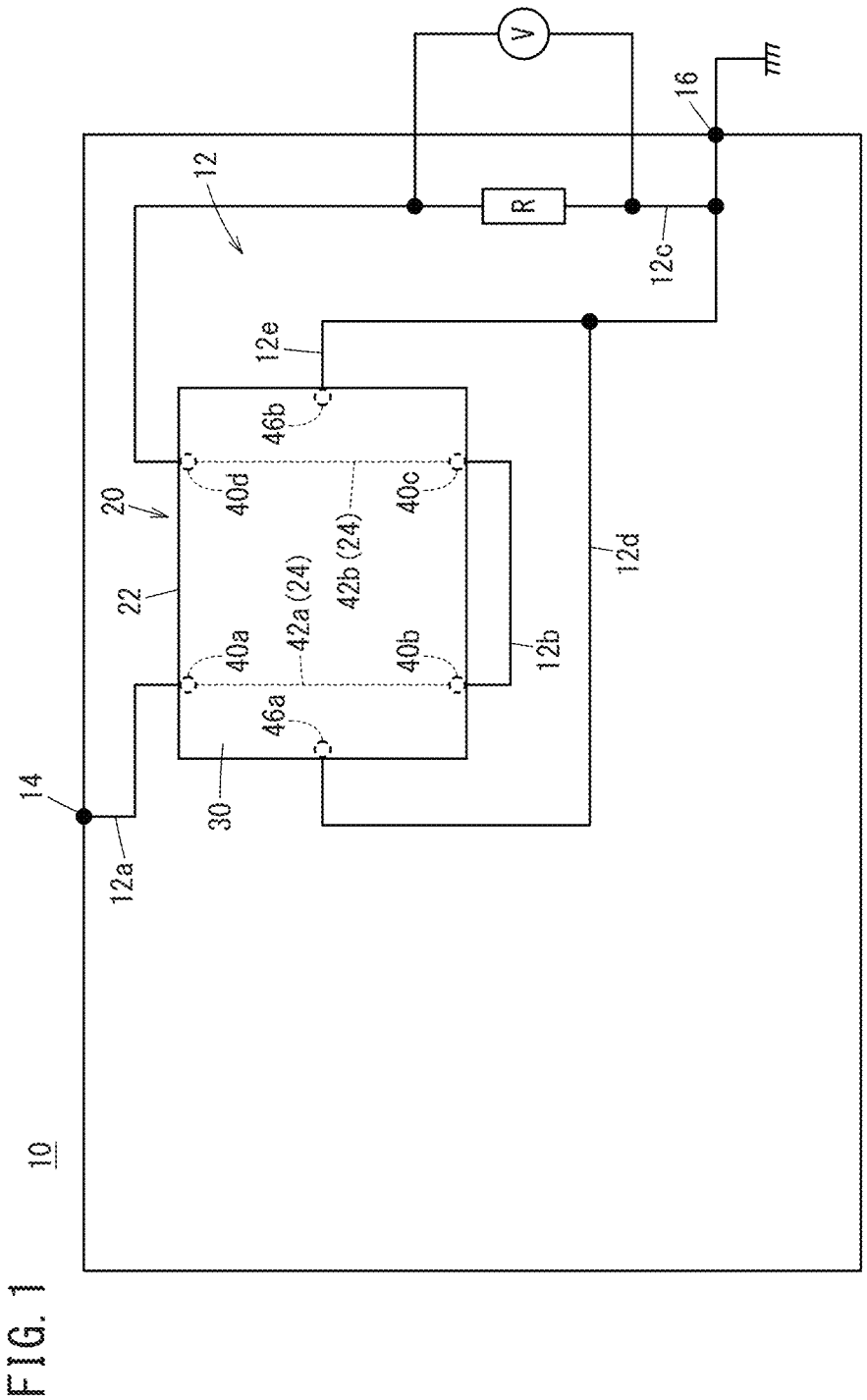
FIG. 1 is a schematic view of a main printed circuit board.

FIG. 1 is a schematic view of a main printed circuit board 10. The main printed circuit board 10 is used in a machine tool. On at least one surface of the main printed circuit board 10, a wiring pattern (not shown) of an electronic circuit is formed, and a wiring pattern 12 of a degradation detection circuit is formed. Further, the main printed circuit board 10 is provided with a power supply terminal 14 and a ground terminal 16. The power supply terminal 14 is connected to a power supply. The ground terminal 16 is connected to the ground.

The wiring pattern 12 includes a first wiring line 12a, a second wiring line 12b, a third wiring line 12c, a fourth wiring line 12d, and a fifth wiring line 12e. A first end portion, which is one end of the first wiring line 12a, is connected to the power supply terminal 14. A second end portion, which is the other end of the first wiring line 12a, is connected to a first electrode pad 40a of a printed circuit board 20 for degradation detection described later. A first end portion, which is one end of the second wiring line 12b, is connected to a first electrode pad 40b of the printed circuit board 20 for degradation detection. A second end portion, which is the other end of the second wiring line 12b, is connected to a first electrode pad 40c of the printed circuit board 20 for degradation detection. A first end portion, which is one end of the third wiring line 12c, is connected to a first electrode pad 40d of the printed circuit board 20 for degradation detection. A second end portion, which is the other end of the third wiring line 12c, is connected to the ground terminal 16. A resistor R is connected in series to the third wiring line 12c. A voltage sensor V for detecting a voltage across the resistor R is connected to both ends of the resistor R. A first end portion, which is one end of the fourth wiring line 12d, is connected to a second electrode pad 46a of the printed circuit board 20 for degradation detection. A second end portion, which is the other end of the fourth wiring line 12d, is connected to the ground terminal 16. A first end portion, which is one end of the fifth wiring line 12e, is connected to a second electrode pad 46b of the printed circuit board 20 for degradation detection. A second end portion, which is the other end of the fifth wiring line 12e, is connected to the ground terminal 16.

The wiring pattern 12 shown in FIG. 1 is an example. The shape of the wiring pattern 12 is not limited to the shape shown in FIG. 1.

As will be described later, a wiring pattern 24 formed on the printed circuit board 20 for degradation detection includes a wiring line 42a and a wiring line 42b. The wiring line 42a is connected to the first electrode pad 40a and the first electrode pad 40b. The wiring line 42b is connected to the first electrode pad 40c and the first electrode pad 40d. The first wiring line 12a, the wiring line 42a, the second wiring line 12b, the wiring line 42b, and the third wiring line 12c are connected in series. The wiring line 42a and the wiring line 42b are thinner than the wiring lines (not shown) of the above-described electronic circuit of the main printed circuit board 10. Therefore, the wiring line 42a and the wiring line 42b are easily disconnected. When a predetermined voltage is applied to the power supply terminal 14 in a state where the wiring line 42a and the wiring line 42b (and the first wiring line 12a to the third wiring line 12c) are not disconnected, the voltage sensor V detects a voltage across the resistor R. On the other hand, when a predetermined voltage is applied to the power supply terminal 14 in a state where the wiring line 42a or the wiring line 42b is disconnected, the voltage sensor V detects a voltage of 0. Thus, the detection value of the voltage sensor V serves as an index indicating the degree of degradation of the printed circuit board 20 for degradation detection. As a result, the detection value of the voltage sensor V serves as an index indicating the degree of degradation of the wiring pattern formed on the main printed circuit board 10.

2. Printed Circuit Board 20 for Degradation Detection

Hereinafter, a first embodiment and a second embodiment will be described as specific examples of the printed circuit board 20 for degradation detection.

2-1. First Embodiment

Figure 2:
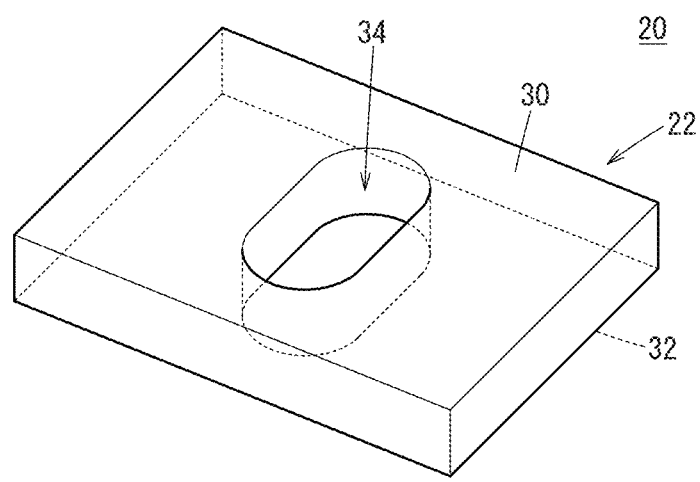
FIG. 2 is a perspective view of a printed circuit board for degradation detection according to a first embodiment.
Figure 3:
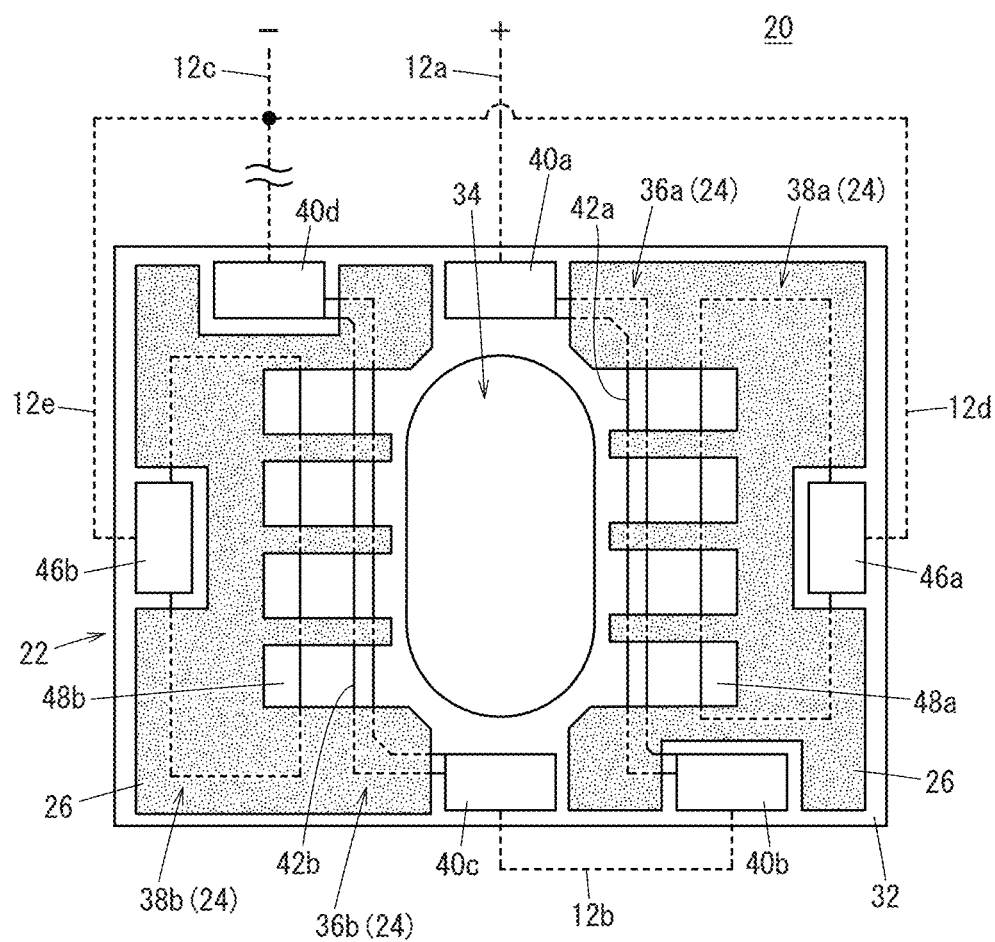
FIG. 3 is a bottom view of the printed circuit board for degradation detection according to the first embodiment.

FIG. 2 is a perspective view of the printed circuit board 20 for degradation detection according to a first embodiment. FIG. 3 is a bottom view of the printed circuit board 20 for degradation detection according to the first embodiment. The printed circuit board 20 for degradation detection includes an insulating substrate 22, the wiring pattern 24, and a solder resist 26. In FIG. 3, the solder resist 26 is indicated by dots. In FIG. 3, the outline of the wiring pattern 24 covered with the solder resist 26 is indicated by broken lines.

The insulating substrate 22 is a plate piece formed of an insulating member. In the first embodiment, among the outer surfaces of the insulating substrate 22, the outer surface facing the main printed circuit board 10 is referred to as a back surface 32, and the outer surface facing the opposite side to the back surface 32 is referred to as a front surface 30. The insulating substrate 22 includes a through hole (penetrating portion) 34 penetrating from a substantially central portion of the back surface 32 to a substantially central portion of the front surface 30. Small-diameter through-holes, such as vias, commonly used in printed wiring boards cannot allow liquid (cutting fluid) to flow therethrough. On the other hand, the through hole 34 has a size that allows the liquid (cutting fluid) to flow from the front surface 30 to the back surface 32. In the first embodiment, the shape of the through hole 34 in a plan view is an ellipse. However, the shape of the through hole 34 is not limited thereto.

The wiring pattern 24 is formed of a conductor such as copper and is printed on the back surface 32 of the insulating substrate 22. The wiring pattern 24 includes two sensor portions 36a and 36b that are easily disconnected, and two disconnection promoting portions 38a and 38b that promote disconnection of the sensor portions 36a and 36b.

The sensor portion 36a includes the pair of first electrode pads 40a and 40b and the wiring line 42a described above. The first electrode pad 40a and the first electrode pad 40b are disposed at two opposing edge portions, respectively, among a plurality of edge portions of the back surface 32. The wiring line 42a longitudinally crosses the back surface 32 and passes around the through hole 34.

The sensor portion 36b includes the pair of first electrode pads 40c and 40d and the wiring line 42b described above. The first electrode pad 40c and the first electrode pad 40d are disposed at two opposing edge portions, respectively, among the plurality of edge portions of the back surface 32. The wiring line 42b longitudinally crosses the back surface 32 and passes around the through hole 34.

The wiring line 42a is disposed on one side (right side in FIG. 3) of the through hole 34 in the lateral direction. The wiring line 42b is disposed on the other side (left side in FIG. 3) of the through hole 34 in the lateral direction. The wiring line 42a and the wiring line 42b are parallel to the longitudinal direction of the through hole 34.

As described above, the wiring lines 42a and 42b are thin. Further, as will be described later, at least a portion of the wiring line 42a and at least a portion of the wiring line 42b are exposed to the atmosphere in the vicinity of the through hole 34. For this reason, the wiring lines 42a and 42b come into contact with the cutting fluid that flows from the front surface 30 through the through hole 34 and is guided to the back surface 32, and are corroded. When the corrosion progresses, each of the wiring line 42a and the wiring line 42b is disconnected.

The disconnection promoting portion 38a includes one second electrode pad 46a and a ground portion 48a connected to the second electrode pad 46a. The second electrode pad 46a is disposed at an edge portion of the back surface 32. The ground portion 48a is adjacent to the wiring line 42a with a predetermined interval therebetween.

The disconnection promoting portion 38b includes one second electrode pad 46b and a ground portion 48b connected to the second electrode pad 46b. The second electrode pad 46b is disposed at an edge portion of the back surface 32. The ground portion 48b is adjacent to the wiring line 42b with a predetermined interval therebetween.

The shape of the wiring pattern 24 (the shape and arrangement of the sensor portions 36a and 36b and the disconnection promoting portions 38a and 38b) shown in FIG. 3 is merely an example. The shape of the wiring pattern 24 is not limited to the shape shown in FIG. 3.

When the cutting fluid accumulates across the wiring line 42a and the ground portion 48a, and a potential difference is generated between the wiring line 42a and the ground portion 48a, copper ions move from the wiring line 42a to the ground portion 48a. As a result of the movement of copper ions, the corrosion of the wiring line 42a progresses and disconnection occurs therein. Similarly, when the cutting fluid accumulates across the wiring line 42b and the ground portion 48b, and a potential difference is generated between the wiring line 42b and the ground portion 48b, copper ions move from the wiring line 42b to the ground portion 48b. As a result of the movement of copper ions, the corrosion of the wiring line 42b progresses and disconnection occurs therein.

The solder resist 26 covers a portion of the back surface 32, a portion of each of the wiring lines 42a and 42b, and a portion of each of the ground portions 48a and 48b. The solder resist 26 allows a portion of the back surface 32, a portion of each of the wiring lines 42a and 42b, and a portion of each of the ground portions 48a and 48b to be exposed to the atmosphere. That is, the wiring lines 42a and 42b and the ground portions 48a and 48b are respectively partially covered with the solder resist 26. Also, the wiring lines 42a and 42b and the ground portions 48a and 48b are respectively partially exposed to the atmosphere.

Around the through hole 34, a portion of the wiring line 42a that is exposed to the atmosphere and a portion of the wiring line 42a that is covered with the solder resist 26 are alternately arranged. On the outer side of the wiring line 42a, a portion of the disconnection promoting portion 38a that is exposed to the atmosphere and a portion of the disconnection promoting portion 38a that is covered with the solder resist 26 are alternately arranged. Note that, on the outer side of the exposed portion of the wiring line 42a, there is a portion of the back surface 32 that is exposed to the atmosphere. On the outer side of the portion of the back surface 32 that is exposed to the atmosphere, there is a portion of the disconnection promoting portion 38a that is exposed to the atmosphere. Further, on the outer side of a portion of the wiring line 42a that is covered with the solder resist 26, there is a portion of the back surface 32 that is covered with the solder resist 26. On the outer side of the portion of the back surface 32 that is covered with the solder resist 26, there is a portion of the disconnection promoting portion 38a that is covered with the solder resist 26. The wiring line 42b, the disconnection promoting portion 38b, and the back surface 32 are arranged in the same manner as the wiring line 42a, the disconnection promoting portion 38a, and the back surface 32.

The cutting fluid is likely to accumulate at the boundary between the wiring pattern 24 and the solder resist 26. The boundaries between the wiring line 42a and the solder resist 26 are arranged around the through hole 34. Further, the boundaries between the wiring line 42b and the solder resist 26 are arranged around the through hole 34. According to such a structure, the cutting fluid that flows from the front surface 30 through the through hole 34 and is guided to the back surface 32 is likely to accumulate at each boundary. For this reason, the wiring line 42a is easily corroded and disconnected. In addition, the wiring line 42b is easily corroded and disconnected.

In the first embodiment, the cutting fluid adhering to the front surface 30 of the insulating substrate 22 flows through the through hole 34, is guided to the back surface 32, and accumulates in a gap between the main printed circuit board 10 and the printed circuit board 20 for degradation detection. Therefore, according to the first embodiment, it is possible to promote the disconnection of the wiring pattern 24 (wiring lines 42a and 42b) formed on the back surface 32 of the insulating substrate 22. According to the first embodiment, the through hole 34 guides the cutting fluid adhering to the front surface 30, to the back surface 32. Therefore, it is not necessary to form the wiring pattern 24 on the front surface 30 of the insulating substrate 22. As a result, the printed circuit board 20 for degradation detection according to the first embodiment can suppress an increase in manufacturing cost as compared with a printed circuit board for degradation detection in which wiring patterns are formed on the front surface and the back surface.

In the first embodiment, the wiring lines 42a and 42b are provided around the through hole 34. Furthermore, the boundaries between the wiring line 42a and the solder resist 26, and the boundaries between the wiring line 42b and the solder resist 26, are arranged around the through hole 34. On the other hand, the first electrode pads 40a to 40d and the second electrode pads 46a and 46b are provided at the edge portions of the back surface 32 of the insulating substrate 22, and are not provided around the through hole 34. Therefore, the cutting fluid flowing to the back surface 32 comes into contact with the wiring lines 42a and 42b without being blocked by the first electrode pads 40a to 40d and the second electrode pads 46a and 46b. Furthermore, the cutting fluid accumulates at the boundaries between the wiring line 42a and the solder resist 26. In addition, the cutting fluid accumulates at the boundaries between the wiring line 42b and the solder resist 26. According to such a feature of the first embodiment as well, it is possible to promote the disconnection of the wiring pattern 24 (wiring lines 42a and 42b).

2-2. Second Embodiment

Figure 4:
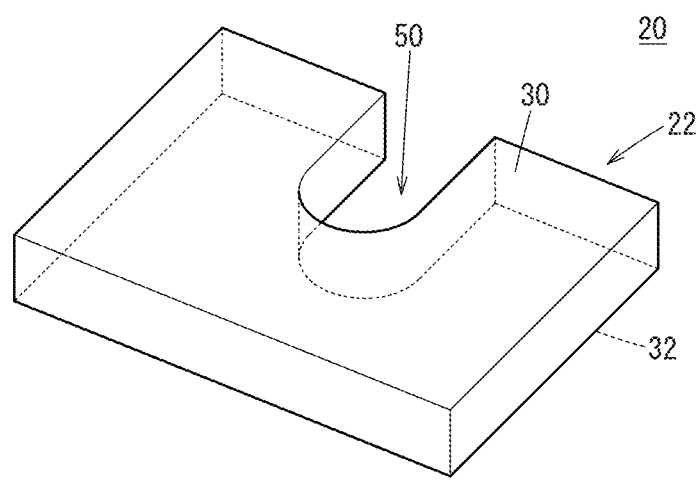
FIG. 4 is a perspective view of a printed circuit board for degradation detection according to a second embodiment.
Figure 5:
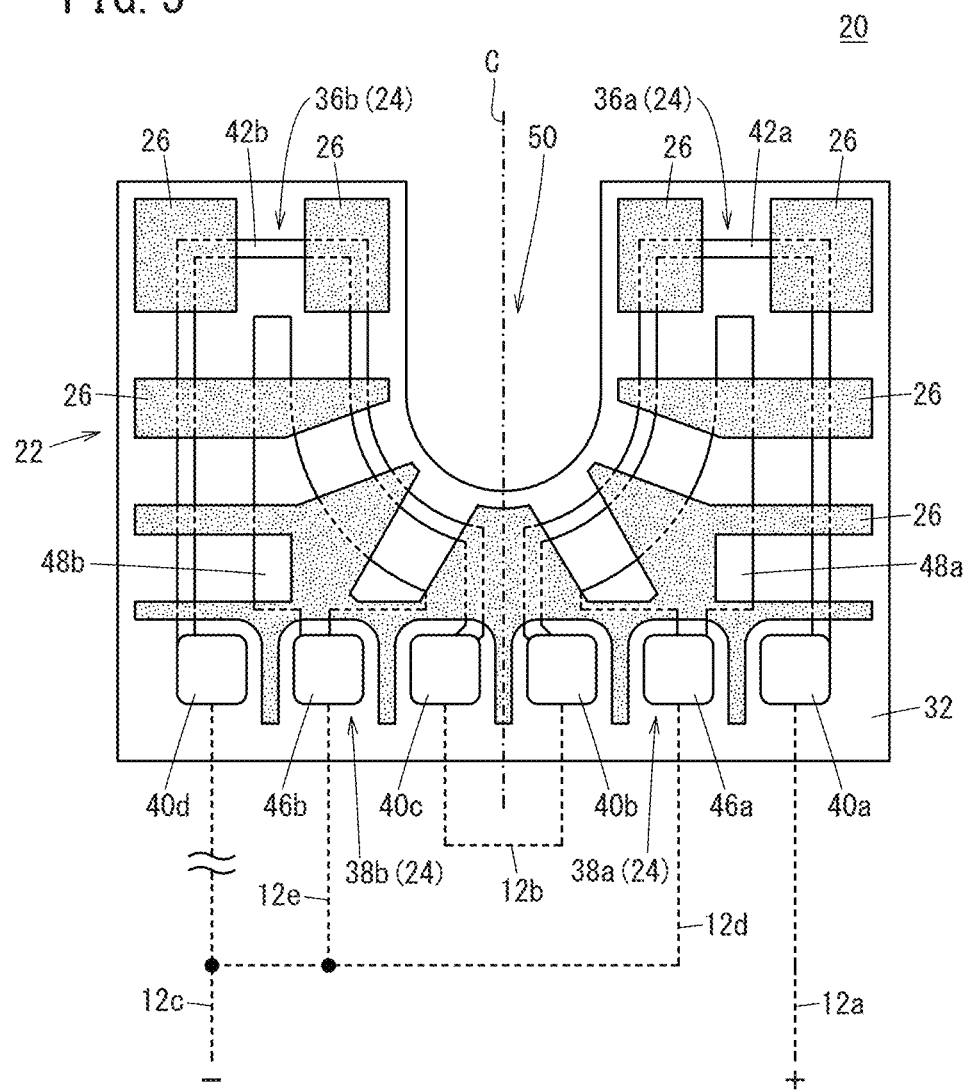
FIG. 5 is a bottom view of the printed circuit board for degradation detection according to the second embodiment.

FIG. 4 is a perspective view of a printed circuit board 20 for degradation detection according to a second embodiment. FIG. 5 is a bottom view of the printed circuit board 20 for degradation detection according to the second embodiment. In the second embodiment, the same components as those of the first embodiment are denoted by the same reference numerals, and detailed description thereof will be omitted. In FIG. 5, the outline of the wiring pattern 24 covered with the solder resist 26 is indicated by broken lines.

The insulating substrate 22 of the second embodiment includes a cutout portion (penetrating portion) 50, instead of the through hole 34 of the first embodiment. The cutout portion 50 is a portion formed by cutting out a portion of the insulating substrate 22 from an edge portion of the insulating substrate 22.

The sensor portion 36a and the disconnection promoting portion 38a are provided on one side (right side in FIG. 5) of the back surface 32. The sensor portion 36b and the disconnection promoting portion 38b are provided on the other side (left side in FIG. 5) of the back surface 32. The first electrode pads 40a to 40d and the second electrode pads 46a and 46b are provided in a concentrated manner on one edge portion of the back surface 32 of the insulating substrate 22. The second electrode pad 46a is provided between the first electrode pad 40a and the first electrode pad 40b. The second electrode pad 46b is provided between the first electrode pad 40c and the first electrode pad 40d. The wiring line 42a is formed so as to pass through the periphery of the cutout portion 50 and the two edge portions. The ground portion 48a is located on the inner side of the wiring line 42a. The wiring line 42b is formed so as to pass through the periphery of the cutout portion 50 and the two edge portions. The ground portion 48b is located on the inner side of the wiring line 42b. The shape of the wiring line 42a and the shape of the wiring line 42b are line-symmetric about a center line C of the back surface 32. Similarly, the shape of the ground portion 48a and the shape of the ground portion 48b are line-symmetric about the center line C of the back surface 32.

The second embodiment provides the same effect as the first embodiment. In the second embodiment, the first electrode pads 40a to 40d and the second electrode pads 46a and 46b are provided in a concentrated manner on one edge portion of the back surface 32 of the insulating substrate 22. Therefore, the cutting fluid adhering to the main printed circuit board 10 is likely to enter the gap between the main printed circuit board 10 and the printed circuit board 20 for degradation detection.

The shape of the wiring pattern 24 (the shape and arrangement of the sensor portions 36a and 36b, and the shape and arrangement of the disconnection promoting portions 38a and 38b) shown in FIG. 5 is merely an example. The shape of the wiring pattern 24 is not limited to the shape shown in FIG. 5.

3. Modification

In the first embodiment and the second embodiment, the solder resist 26 is provided. Alternatively, the entire wiring pattern 24 may not be covered with the solder resist 26 and may be exposed to the atmosphere. In this modification, the probability of occurrence of corrosion and the probability of occurrence of disconnection of the wiring pattern 24 (wiring lines 42a and 42b) are lower than those in the first embodiment and the second embodiment. However, similarly to the first embodiment and the second embodiment, this modification also provides the function of corroding the wiring pattern 24 (wiring lines 42a and 42b) and the function of disconnecting the wiring pattern 24 (wiring lines 42a and 42b).

The width of the wiring line 42a and the width of the wiring line 42b may be different from each other. In this case, the resistor R connected to the wiring line 42a may be different from the resistor R connected to the wiring line 42b. In addition, the voltage sensor V connected to the wiring line 42a may be different from the voltage sensor V connected to the wiring line 42b. By modifying in this manner, the degradation of the main printed circuit board 10 can be detected in two stages.

4. Invention that can be Obtained from Embodiments

The invention that can be grasped from the above-described embodiments and modification will be described below.

According to an aspect of the present invention, provided is the printed circuit board (20) for degradation detection including the insulating substrate (22) and the wiring pattern (24) for degradation detection formed on the outer surface of the insulating substrate, the printed circuit board for degradation detection being attached to the main printed circuit board (10) to be subjected to degradation detection, wherein the wiring pattern is formed on the back surface (32) that is the outer surface of the insulating substrate and that is located on the side of the main printed circuit board, and the insulating substrate includes the penetrating portion (34, 50) penetrating from the back surface to the front surface (30) that is located on the opposite side to the back surface.

In the aspect of the present invention, the penetrating portion may be the through hole (34) penetrating the insulating substrate from the back surface to the front surface.

In the aspect of the present invention, the penetrating portion may be the cutout portion (50) formed by cutting out a portion of the insulating substrate from the edge portion of the insulating substrate.

In the aspect of the present invention, the solder resist (26) that covers the back surface and a portion of the wiring pattern and that allows a portion of the wiring pattern to be exposed may be provided.

In the aspect of the present invention, the portion of the wiring pattern that is exposed from the solder resist may be provided around the penetrating portion.

It should be noted that the printed circuit board for degradation detection according to the present invention is not limited to the above-described embodiments and modification, and various configurations can be adopted therein without departing from the gist of the present invention.

The invention claimed is:

1. A printed circuit board for degradation detection comprising: an insulating substrate and a wiring pattern for degradation detection formed on an outer surface of the insulating substrate, the printed circuit board for degradation detection being attached to a main printed circuit board to be subjected to degradation detection, wherein the wiring pattern is formed on a back surface that is the outer surface of the insulating substrate and that is located on a side of the main printed circuit board, and the insulating substrate includes
a penetrating portion penetrating from the back surface to a front surface that is located on an opposite side to the back surface, and
a solder resist configured to cover the back surface and a plurality of first portions of the wiring pattern and allow a plurality of second portions of the wiring pattern to be exposed, and
a boundary between each of the plurality of second portions of the wiring pattern and the solder resist is provided around the penetrating portion.

2. The printed circuit board for degradation detection according to claim 1, wherein
the penetrating portion is a through hole penetrating the insulating substrate from the back surface to the front surface.

3. The printed circuit board for degradation detection according to claim 1, wherein
the penetrating portion is a cutout portion formed by cutting out a portion of the insulating substrate from an edge portion of the insulating substrate.

4. The printed circuit board for degradation detection according to claim 1, wherein
the back surface is formed with an exposed area that is not covered by the solder resist, and an opening of the penetrating portion and at least one of the plurality of second portions are disposed within the same exposed area.

* * * * *